United States Patent [19]

Leuschner

[11] Patent Number: 4,628,214

[45] Date of Patent: Dec. 9, 1986

[54] BACK BIAS GENERATOR

[75] Inventor: Horst Leuschner, Phoenix, Ariz.

[73] Assignee: SGS Semiconductor Corporation, Phoenix, Ariz.

[21] Appl. No.: 736,851

[22] Filed: May 22, 1985

[51] Int. Cl.[4] .................... H02M 3/18; H03K 17/687; H03K 17/30

[52] U.S. Cl. .................................. 307/296 R; 307/304

[58] Field of Search ............... 307/200 B, 246, 296 R, 307/296 A, 297, 304

[56] References Cited

U.S. PATENT DOCUMENTS

| | | | |
|---|---|---|---|
| 4,233,672 | 11/1980 | Suzuki et al. | 307/296 R X |
| 4,259,686 | 3/1981 | Suzuki et al. | 307/304 X |
| 4,384,218 | 5/1983 | Shimotori et al. | 307/297 X |
| 4,403,158 | 9/1983 | Slemmer | 307/296 A X |
| 4,454,571 | 6/1984 | Miyashita | 307/296 R X |
| 4,455,493 | 6/1984 | Morton et al. | 307/296 R |
| 4,547,682 | 10/1985 | Bialas, Jr. et al. | 307/304 X |
| 4,559,548 | 12/1985 | Iizuka et al. | 307/296 R X |

FOREIGN PATENT DOCUMENTS

| | | | |
|---|---|---|---|
| 87470 | 7/1980 | Japan | 307/296 R |
| 1022270 | 6/1983 | U.S.S.R. | 307/296 R |

*Primary Examiner*—Larry N. Anagnos
*Attorney, Agent, or Firm*—M. David Shapiro

[57] ABSTRACT

The invention comprises an improved back bias generator for an integrated circuit wherein a transistor circuit first acts as an isolation device during the charging phase of a charge pump capacitor and acts as a coupling device during a discharge phase of the capacitor, thus providing a higher back bias voltage than is available from prior art circuits and wherein the charge pump capacitor is oriented in the circuit so that its source/-drain terminal cannot conduct to the substrate by way of the parasitic diode therebetween.

18 Claims, 9 Drawing Figures

BACK BIAS GENERATOR

FIELD OF THE INVENTION

The invention relates to an improved, higher voltage on-chip back bias generator for use in and with NMOS and CMOS technology.

BACKGROUND OF THE INVENTION

Prior art NMOS and even some CMOS integrated circuits are equipped with means for applying a negative voltage, $V_{BB}$, to the substrate with respect to the ground node, $V_{SS}$. Several beneficial effects are realized from that practice:

First, junction capacitances are greatly reduced since the N+/P junctions have a minimum reverse bias equal to the back bias $V_{BB}$. Since the capacitance/voltage characteristic of a junction diode is inherently a square root function, the first few volts of reverse bias has the largest effect on reduction of the junction capacitance.

Second, threshold voltages are effected by the back bias with the largest effect again being seen during the first two volts of back bias (See FIG. 1) because of the aforementioned square root capacitance/voltage relationship and also because of the fact that the surface doping is heavier than the substrate doping.

Third, other transistor characteristics, such as punch through resistance, are also improved by increasing back bias.

In the interest of conserving chip terminal connections, negative back bias is generally provided on-chip rather than being applied from off-chip.

A typical prior art on-chip back bias generator is shown in schematic form in FIG. 2. It comprises a one stage capacitive charge pump. An on-chip ring oscillator having a frequency of between five and twenty megahertz (not shown) is used to drive node 10 through push-pull buffer 12, 14, 16. One deficiency of the device is illustrated by the fact that it does not provide a voltage swing fully equal to $V_{CC}-V_{SS}$. Transistor 14 is typically an enhancement mode transistor which causes a voltage drop of $V_{T14}$. During the positive swing of node 10 (see FIG. 3 at reference numeral 11), node 24 is clamped by the enhancement type transistor 28 to a voltage of $+V_{T28}$ above $V_{SS}$. Thus capacitor 30, a depletion mode transistor with source and drain shorted together, is charged with its positive terminal (connected to node 10) equal to a value of $+(V_{cc}-V_{T14})$ volts and with its negative terminal (connected to node 24) equal to a value of $+V_{T28}$, the forward drop through transistor 28. During the negative swing of node 10 (see FIG. 3, reference numeral 20), the positive capacitor terminal (connected to node 10), previously at $+(V_{CC}-V_{T14})$ is pulled to zero volts and, thus, the negative capacitor 30 terminal goes to a voltage equal to $-(V_{CC}-V_{T14}-V_{T28})$, if there is no charge transfer through transistor 34.

If $V_{BB}$ is less negative than $-(V_{CC}-V_{T14}-V_{T28}-V_{T34})$, there will be a charge transfer and $V_{BB}$ is pulled negative through the diode connected enhancement transistor 34 until $V_{BB}$ reaches the above specified voltage, $-(V_{CC}-V_{T14}-V_{T28}-V_{T34})$. For back bias generators in the prior art having charge storage nodes, a potentially harmful side effect is that parasitic diode (shown in FIG. 4) could be turned on. Any diode current will inject electrons into the substrate, which, due to long minority carrier lifetime, could diffuse to the charge storage nodes and discharge those nodes. Parasitic diode 36 is in parallel with diode connected enhancement transistor 34 and thus this translates to the requirement that the gate-to-source=drain-to-source voltage drop, $V_{T34}$ (at $V_{BS}=+V_{T34}$), where $V_{BS}$ is the Bulk to Source (back bias voltage) between substrate and source of transistor 34, must be less than the forward voltage, $V_F$, of N+/P diode 36.

The current/voltage characteristic of the N+/P diode is logarithmic:

$$V_F=(k^*T/q)^*ln(I/I_s)$$

with $I_s$ being the saturation current at zero bias (which is proportional to the diode area). The current/voltage characteristic of transistor 34 "diode" is a square law function $$V_{GS}\sim\text{square root of } I_{DS}$$

It is clear, then, that the requirement that $V_F$ must be smaller than $V_{GS}$ is a matter of absolute current tolerance.

In order to minimize electron injection by forward current through diode 36, FIG. 4, it is necessary to minimize forward voltage across diode 36 (VF) and/or minimize the area (size) of diode 36.

Beside the above mentioned voltage deficiencies which reduce maximum back bias voltage output, the circuit shown in FIG. 2 also has some current deficiencies. For a high output voltage, it is desirable to have the threshold voltage of transistors 28 and 34 as low as possible. In addition, the threshold voltage of transistor 34 should be low in order to prevent the junction diode from turning on. During second phase 32 (see FIG. 3) transistor 28 is supposed to be turned off, otherwise the charge of capacitor 30 would leak to $V_{SS}$ rather than being transferred to $V_{BB}$. But during second phase 32, the back bias of transistor 28 is positive with a value of $V_{T34}$. This positive back bias lowers the threshold voltage to such a degree that transistor 28 may turn on partially. To prevent that, the back bias for transistor 28 must be increased by reducing $V_{T34}$.

But during phase one 26 (see FIG. 3), transistor 34 may then leak. (FIG. 3 also illustrates the excursions of node 24, see reference numeral 13.) The following relationship holds:

$$V_{BB}(\max)\doteq[V_{CC}-V_{T14}(\text{at } V_{BS}\approx 4.0\text{ v}+|V_{BB}|)-V_{T28}(\text{at } V_{BS}=V_{BB})-V_{T34}(\text{at } V_{BS}=-V_{T14})]$$

The dilemma of contradicting requirements is illustrated in the drawings of FIG. 5a, 5b and 5c. It is also necessary to consider that transistor 34 usually is quite large in order to minimize the forward voltage drop, but this usually translates to a requirement for a large diode area. FIG. 5a addresses transistor 28 during phase two 32 (see FIG. 3) and shows that:

$V_{24}\approx-3.5$ volts, and $V_{BB}\approx-3.0$ volts $V_{DS}\approx+3.5$ volts (large S/D voltage)

$V_{SB}+0.5$ volts (positive 'back' bias)

$I_{DS}\stackrel{!}{=}$ minimum leakage under above adverse conditions

FIG. 5b addresses transistor 34 during phase two 32 (see FIG. 3) and shows that:

$V_{24}\approx-3.5$ volts, and $V_{SB}=V_{DS}\approx 0.2$ volts $\doteq V_{T34}$ $I_{DX}\doteq$ negligible (current through parasitic diode DX) which requires $V_{T34}$ to be high.

FIG. 5c addresses transistor 34 during phase one 26 (see FIG. 3) and shows that:

$V_{24}=V_{T28}\approx 0.7$ volts, and $V_{BB}=-3.0$ volts $V_{DS}\approx +3.7$ volts (high source drain voltage)

$V_{SB}=0$ volts (zero back bias)

$I_{DS}\doteq$ minimum leakage (under above adverse conditions)

One prior art attempt at a solution set as a goal getting the full value of $V_{CC}$ as a charge across capacitor 30. Referring to FIG. 6, the positive terminal of capacitor 30 (connected to node 10) was charged fully to $V_{CC}$ by a bootstrap (not shown, but the circuit would be similar to that of FIG. 2, reference numeral 19) to pull up gate 15 of the push-pull driver 14, and the negative terminal of capacitor 30 (connected to node was clamped solidly to $V_{SS}$ by disconnecting the gate of transistor 28 from its drain and pulling it to $V_{CC}$ during phase one 26 (see FIG. 3). During phase two 32, the gate of transistor 28 is connected to the drain (node 24), but the pull-up of the gate cannot be disconnected and leaks large amounts of current from $V_{CC}$ to node 24. During phase one 26 (FIG. 3) transistor 34 must isolate $V_{BB}$ from node 24 which requires negligible leakage of transistor 34 with +0.2 V back bias, +0.2 V $V_{GS}$ and a drain source voltage of approximately $(V_{BB}+V_{T34})=4.0$ volts. This would require a relative high threshold for transistor 34, but the high threshold voltage would cause a high positive (forward bias) back bias during phase two 32 (FIG. 3) for transistor 28.

During phase one 26, transistor 28 operating conditions are as follows:

$V_{GS}=5.0$ volts $V_{DS}=0$ volts

During phase two 32, transistor 28 operating conditions are as follows:

$V_G=-V_{T31}$ volts $V_S\approx -3.5$ volts $V_{GS}\approx(3.5-V_{T31})\approx +3.0$ volts $V_{SB}=+0.2$ volts Transistor 31 is not only leaking during phase two 32 (FIG. 3), but it is solidly turned on with $V_S=-V_{BB}-V_{T34}$, $V_G=0$ and $V_D=V_{CC}$, resulting in a $V_{DS}$ of approximately 9.0 volts, a $V_{BS}$ of approximately +0.2 volts and a $V_{GS}$ of approximately 3.2 volts. In the particular prior art circuit, the geometry of transistor 31 was 6 by 14 microns, not very small. The purpose of resistor 33 was to limit the peak current (C*dv/dt) through capacitor 30 which is also the peak current through the parallel combination of transistor 34 and the junction substrate diode (not shown) if it were not for the large leakage current from $V_{CC}$. By limiting the current through transistor 34 (by limiting the current through transistor 16), the maximum $V_{GS}$ voltage drop is limited so that it (hopefully) does not exceed a $V_F$ of the junction diode.

This effort to improve the voltage deficiencies of the circuit by removing the voltage drop across the clamping diode 28 appears to have introduced such a gross current deficiency that circuit performance is probably worse than prior to the "improvements".

SUMMARY OF THE INVENTION

The foregoing problems and shortcomings of prior art back bias circuits are resolved by the invention herein described by means of a new circuit configuration which reduces the current leakage problems to a negligible level, the new circuit comprising a charge pump capacitor having a driven end and an output end, a recharge and discharge phase, the output end being clamped to prevent it from going more positive than $V_{SS}$ during the recharge phase, and a near ideal (no forward voltage drop) output isolation device which isolates the capacitor from $V_{BB}$ during the recharge phase.

Therefore, it is an object of the invention to provide a back bias circuit for an integrated circuit wherein a capacitor is charged to the full value of $V_{CC}$ and substantially all of that voltage is applied to the substrate.

It is another object of the invention to provide a back bias circuit for an integrated circuit wherein the voltage on the positive end of its charged capacitor is not allowed to exceed zero volts in the positive direction during a recharge phase.

It is still another object of the invention to provide a back bias circuit for an integrated circuit wherein an isolation device is provided at the negative end of its charge pump capacitor and wherein the isolation device is used to isolate the capacitor from the substrate of the integrated circuit during recharge of the capacitor.

It is a still further object of the invention to provide a back bias circuit for an integrated circuit wherein an isolation device is provided at the negative end of its charge pump capacitor and wherein the isolation device is used to isolate the capacitor from the substrate of the integrated circuit during recharge of the capacitor and wherein said isolation device has a minimum forward voltage drop and acts as a coupling device during a discharge phase of the capacitor.

It is yet another object of the invention to reduce electron injection into the substrate by providing a reversal of the source/drain and gate connections of the charge pump capacitor in a back bias generator circuit for an integrated circuit so that the parasitic junction diode of the source/drain terminal of the capacitor will always be reverse biased, thereby preventing electron injection into the substrate.

These and other aspects of the invention will be better understood by careful review of the Detailed Description of the Invention, infra taken together with the drawings, in which.

DETAILED DESCRIPTION OF THE PREFERRED EMBODIMENT OF THE INVENTION

Figure 1:
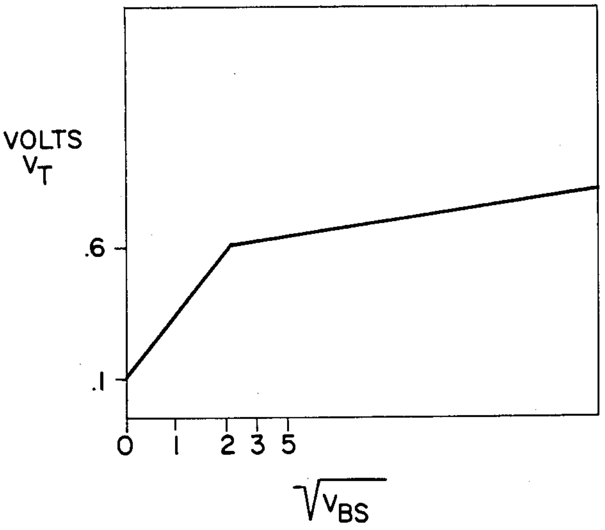
FIG. 1 is a typical graphic portrayal of the relationship between the forward voltage drop $V_T$ and the square root of the back bias applied to the substrate, $\sqrt{V_{BS}}$, in an integrated circuit of the MOS type.
Figure 5A:
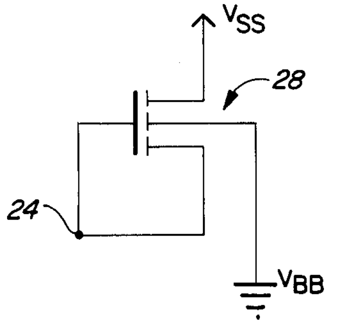
FIG. 5a is an equivalent schematic diagram of transistor 28 of FIG. 2 during a second phase of operation shown in FIG. 3.
Figure 5B:
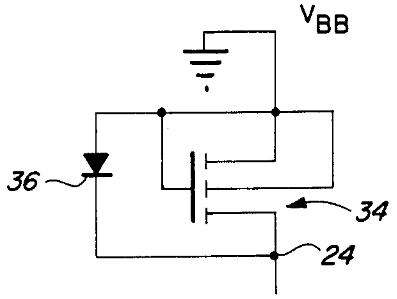
FIG. 5b is an equivalent schematic diagram of transistor 34 of FIG. 2 during the second phase of operation as shown in FIG. 3.
Figure 2:
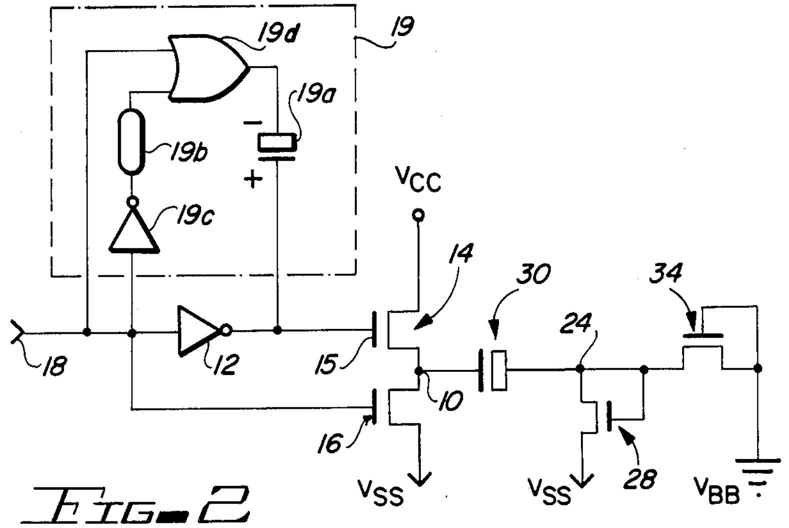
FIG. 2 (PRIOR ART)
FIG. 2 is a schematic illustration of a typical simple back bias circuit of a type used in the prior art.
Figure 5C:
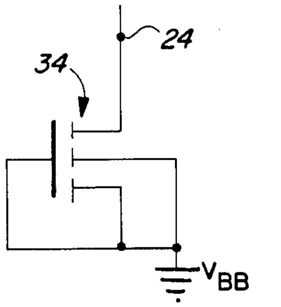
FIG. 5c is an equivalent schematic diagram of the transistor 34 of FIG. 2 during a first phase of operation as shown in FIG. 3.

In the discussion which follows, it will be understood that where like reference numerals are used to identify a circuit component in two or more different Figures, the components so identified perform a similar or identical function in the circuits of the two or more Figures.

Figure 7:
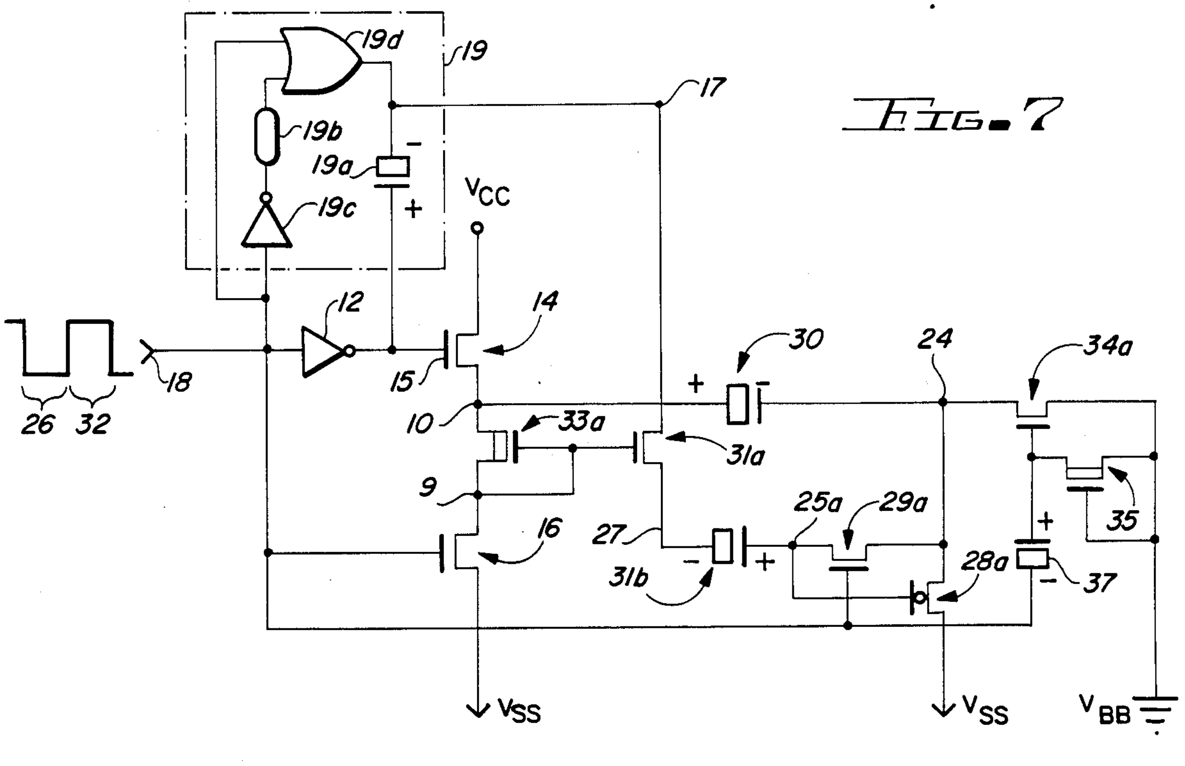
FIG. 7 is a detailed schematic diagram of the preferred embodiment of the back bias generator circuit of the invention.

The preferred embodiment of the invention is depicted in schematic form in FIG. 7. A square wave, which may be generated from a ring oscillator (not shown), for example, is applied to input terminal 18 of the back bias generator of FIG. 7. Input terminal 18 is connected to an input terminal of inverter 12 and to the gate terminal of transistor 16. Input terminal 18 is also connected to an input of inverting amplifier 19*c*, part of bootstrap circuit 19. Bootstrap circuit 19 is a digital differentiator which serves to differentiate the input square wave to provide a short negative pulse in response to the negative going signal at terminal 18. OR gate 19*d* is fed from input terminal 18 and from delay 19*b*. Delay 19*b* is fed from the output of inverter 19*c*.

The source terminal of transistor 16 is connected to $V_{SS}$ and its drain terminal is connected to the source and gate terminals of depletion current source transistor 33*a*. The drain terminal of transistor 33*a* is connected to the source terminal of transistor 14 and to the positive terminal of capacitor 30.

The output terminal of inverter 12 is connected to gate 15 terminal of transistor 14 and to the positive terminal of capacitor 19*a*. The drain terminal of transistor 14 is connected to $V_{CC}$. The negative terminal of capacitor 19*a* is connected to the drain terminal of transistor 31*a*. The gate and source terminals of transistor 33*a* are connected to the gate terminal of transistor 31*a*. The source terminal of transistor 31*a* is connected to the negative terminal of capacitor 31*b*. The positive terminal of capacitor 31*b* is connected to the drain terminal of transistor 29*a* at node 25*a* and to the gate terminal of enhancement transistor 28*a*.

Input terminal 18 is also connected to the gate terminal of transistor 29*a* and to the negative terminal of capacitor 37. The source terminal of transistor 28*a* is connected to $V_{SS}$ and the drain terminal of transistor 28*a* is connected to the source terminal of transistor 29*a*, to the negative terminal of capacitor 30 and to the source terminal of transistor 34*a*.

The positive terminal of capacitor 37 is connected to the drain terminal of depletion transistor 35 and to the gate terminal of transistor 34*a*. The drain terminal of transistor 34*a* is connected to the source and gate terminals of depletion transistor 35, which is diode connected, and to $V_{BB}$. All capacitors are transistors with common source/drain connections, as shown. This completes the description of the circuit of FIG. 7.

Figure 3:
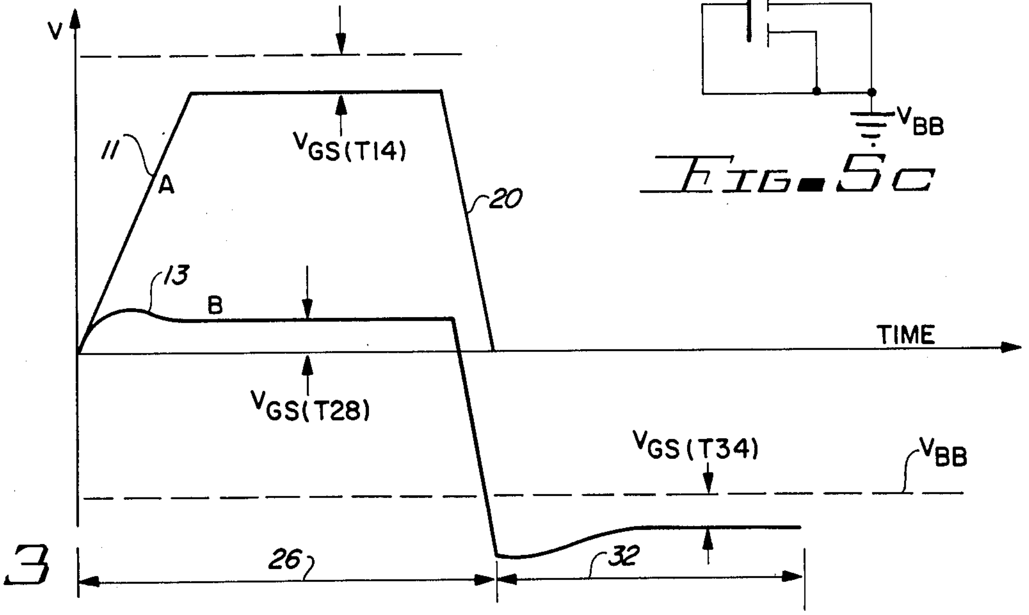
FIG. 3 illustrates, in graphic form, two waveforms of the prior art circuit of FIG. 2.
Figure 6:
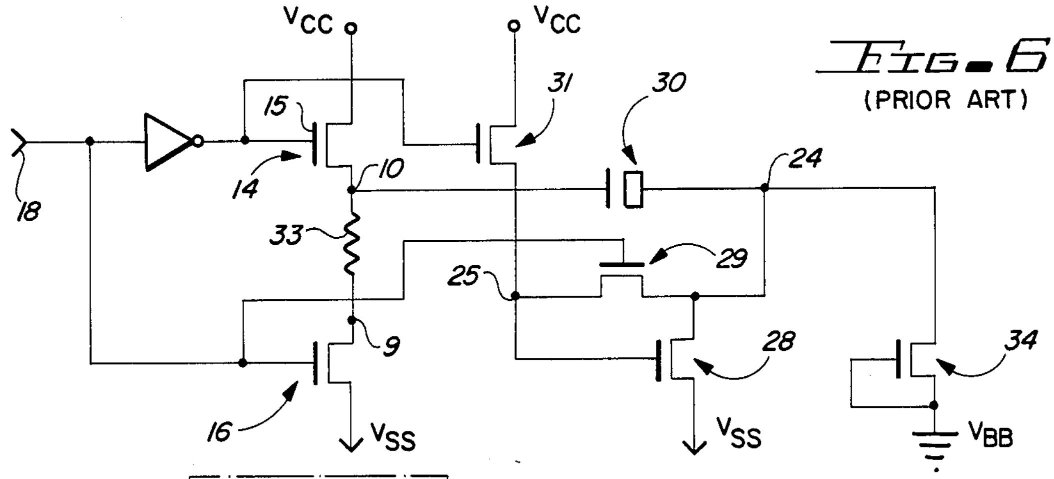
FIG-6 (PRIOR ART)
FIG. 6 is a more detailed schematic diagram of a prior art back bias generator.

It is helpful at this point to compare the prior art back bias generator circuit shown in the schematic diagram of FIG. 6 with the preferred embodiment of the invention shown in like fashion in FIG. 7. It should be noted that the circuit of FIG. 7 has been modified in the following ways from that of FIG. 6:

(1) Current limiting resistor 33 of FIG. 6 is replaced by depletion current source transistor 33*a* in the circuit of FIG. 7. This modification provides good control of the absolute current through transistor 34*a* during phase two 32 (see FIG. 3) but still allows node 10 to settle much faster to its asymtotic value of zero volts.

(2) Transistor 28 of FIG. 6 is modified from one with a "natural" threshold to a enhancement threshold transistor 28*a*, as shown in FIG. 7. Transistor 28*a* has an increased channel length of 2.4 microns as compared to 2.0 microns for transistor 28 (FIG. 6) and its width is decreased from 18 microns to 8 microns since it no longer has to carry a large leakage current.

(3) Pull-up transistor 31 of FIG. 6 is replaced by non-leaky capacitor 31*b* and transistor switch 31*a* of FIG. 7. During phase two 32 (see FIG. 3), when input node 18 goes high, transistor 29*a* is turned on hard by reason of its gate going positive and its source going negative. At that time, one side of capacitor 31*b* is equal to node 24. At the start of phase two, nodes 17 and 9 are at 5.0 volts. Then the source of transistor 31*a* goes to −4.0 volts and a short time later to zero volts with its drain being held at 5.0 volts. Hence, the other side of capacitor 31*b* is clamped to zero volts. At the beginning of phase one, node 17 is still at 5.0 volts and node 9 is at zero volts. Then node 17 goes down to zero volts and node 9 goes up to 5.0 volts, thus switching transistor 31*a* turns on, causing node 27 to go to zero volts while the other side of capacitor 31*b* is pulled by node 24 through the grounded gate of transistor 29*a* to $-V_T$. Later during phase one, node 17 again goes up pulling with it node 25*a* through turned on transistor 31*a*, effectively grounding node 24 in the later half of phase one. These modificatons reduce the leakage of transistor 28*a* to a negligible amount since it is now an enhancement transistor with longer than minimum channel length and slightly narrower width. Of course, these benefits are attained without affecting the ability of transistor 28*a* to clamp to $V_{SS}$ during the other phase of the input.

(4) Output coupling "diode" 34 is replaced by switched transistor 34*a* which is turned on during the time diode 34 would have been conducting and is solidly turned off by application of negative $V_{GS}$ during the period when diode 34 would not be conducting. Since 34*a* is now a switched transistor with $V_{GS}$ on being more than $V_T$, its size may be reduced significantly from about 750 microns to about 200 microns and still not have any significant voltage drop across it. In addition, its channel length may be increased from 2 to 3 microns so that its threshold is slightly higher and more controllable at zero volts $V_{SB}$. This switching is accomplished by a weak current source between gate and source of transistor 34*a* and capacitor 37 which couples the gate of transistor 34*a* to input node 18. Diode connected depletion transistor current source 35 biases the average $V_{GS}$ of transistor 34*a* to zero volts so that during phase one it is negative and during phase two it is more positive than an amount equal to $V_T$.

Figure 4:
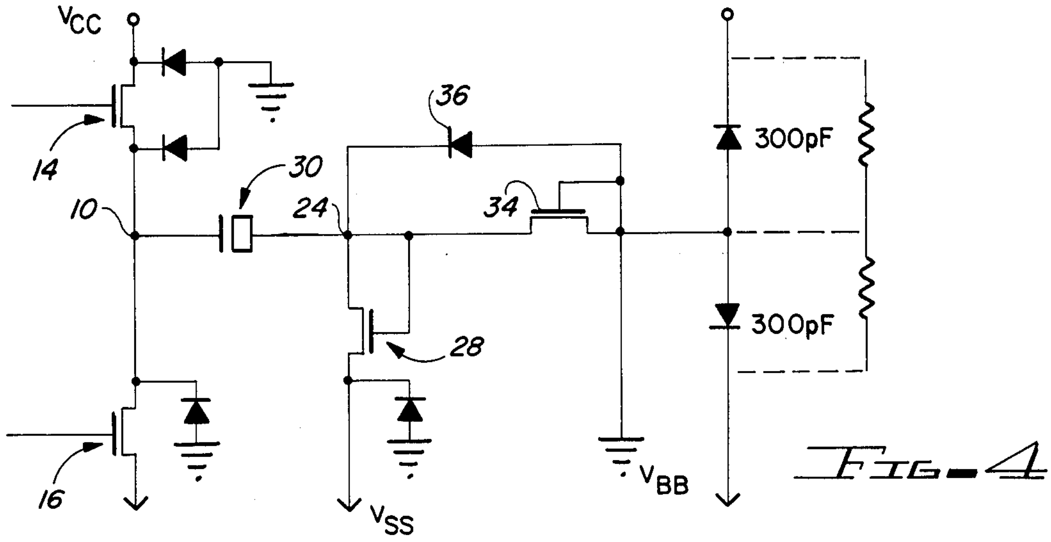
FIG. 4 is a schematic diagram showing parasitic components of the circuit of FIG. 2.

(5) Capacitor 30 is connected in the circuit so that its source/drain terminal is the positive terminal, connected to node 10 and its gate terminal is the negative terminal, connected to node 24. This is reversed from like capacitor 30 of FIGS. 4 and 6. This means that the N+/P− parasitic diode 36 (shown connected from node 24 to the substrate in FIG. 4) from the diffusion side terminal (N+) of capacitor 30 to the substrate (P−) are always back biased and never conduct, thereby preventing electron injection by means of the current through the parasitic diode. While this reversal causes an approximate eight percent reduction in capacitance for capacitor 30, this can be easily overcome by using a physically larger capacitor, if that is deemed necessary. When the source/drain (N+) terminal of capacitor 30 is connected to node 24, that parasitic diode conducts from the negative terminal of capacitor 30 to the substrate any time the parasitic diode is forward biased and discharges dynamic nodes degrading or disabling dynamic circuitry.

With the source/drain (N+) of capacitor 30 connected to node 10, the parasitic diode is always back biased and has no appreciable effect on the circuit. The improved operation of the circuit with the reversed capacitor more than compensates for the small loss of capacitance incurred when the connections are reversed.

It may be seen that the invention comprises an improvement over the prior art on-chip back bias generators in that charge pump capacitor 30 is clamped during the rising edge of the input cycle and during the high steady state period to prevent its $V_{BB}$ connected end from going positive with respect to $V_{SS}$ during the charge cycle. During the rest of the input cycle, the clamping device is held safely off without any appreciable leakage. The charge voltage source is $V_{CC}$, the highest voltage available on the chip, and the circuit employs an enhancement type pull-up device with bootstrapped gate drive for minimum power consumption. During the discharge phase of operation (the phase which occurs on the falling edge of the input waveform and during the low steady state of the input signal), the coupling/decoupling device couples the capacitor to $V_{BB}$ without any appreciable voltage drop. During the charge cycle, capacitor 30 is charged to a voltage nearly equal to the difference between $V_{CC}$ and $V_{SS}$ while it is effectively isolated from $V_{BB}$. During the discharge cycle, capacitor 30 is connected between $V_{SS}$ and the substrate to provide the maximum possible negative voltage $V_{BB}$ which is nearly $$V_{BB}=V_{SS}-(V_{CC}-V_{SS})$$

Thus, it may be seen that on an integrated circuit with a common substrate it is possible to control a transistor switch which has one electrode connected to a voltage more negative than $V_{SS}$ without consuming steady state current from $V_{BB}$.

While the invention has been particularly shown and described herein with reference to a preferred embodiment thereof, it will be understood by those skilled in the art that various other modifications and changes may be made to the present invention from the principles of the invention described above without departing from the spirit and scope thereof as encompassed in the accompanying claims. Therefore, it is intended in the appended claims to cover all such equivalent variations as may come within the scope of the invention as described.

What is claimed is:

1. An improved on-chip back-bias generator circuit for an NMOS integrated circuit using only N channel transistors, the integrated circuit being powered by voltages, $V_{SS}$ and $V_{CC}$ and having a substrate at a voltage $V_{SS}$, the improved circuit adapted for being driven by an output signal from an oscillator, the improvement comprising:

- a charge pump capacitor having an input end and an output end thereof;
- means for applying a charging voltage to said input end of said capacitor, said charging voltage having a value essentially equal to a highest voltage on the integrated circuit chip;
- means for clamping said output end of said capacitor to a voltage essentially equal to a lowest voltage on the integrated circuit during a time when the capacitor is being charged;
- means for essentially isolating said output end of said capacitor from the substrate during said time when said capacitor is being charged; and
- means for coupling said output end of said capacitor to said substrate essentially without any voltage drop during a time when the capacitor is not being charged, said coupling means further comprising:
  - a switched transistor having a source terminal, a drain terminal and a gate terminal;
  - a constant current source, said constant current source being connected between said gate terminal of said switched transistor and the substrate for biasing the average gate-to-source potential difference of the switched transistor to zero volts so that during the time said capacitor is being charged it is negative and during the capacitor non-charging time it is more positive than the switched transistor threshold voltage said source terminal of said switched transistor being connected to said output end of said capacitor, said drain terminal of said switched transistor being connected to the substrate and said gate terminal of said switched transistor being connected via a further capacitor to the oscillator output signal terminal.

2. The improved circuit according to claim 1 wherein said highest voltage is $V_{CC}$.

3. The improved circuit according to claim 2 wherein said input end of said charge pump capacitor is a common connection between a drain and a source of a transistor and said output end of said charge pump capacitor is a gate connection of said transistor.

4. The improved circuit according to claim 1 wherein said lowest voltage is $V_{SS}$.

5. The improved circuit according to claim 4 wherein said input end of said charge pump capacitor is a common connection between a drain and a source of a transistor and said output end of said charge pump capacitor is a gate connection of said transistor.

6. The improved circuit according to claim 1 wherein said highest voltage is $V_{CC}$ and said lowest voltage is $V_{SS}$.

7. The improved circuit according to claim 6 wherein said input end of said charge pump capacitor is a common connection between a drain and a source of a transistor and said output end of said charge pump capacitor is a gate connection of said transistor.

8. The improved circuit according to claim 1 wherein said input end of said charge pump capacitor is a common connection between a drain and a source of a transistor and said output end of said charge pump capacitor is a gate connection of said transistor.

9. The improved circuit according to claim 1 wherein said clamping means further comprises:

- an enhancement threshold transistor having a source terminal, a drain terminal and a gate terminal, said drain terminal of said enhancement threshold transistor being connected to said output end of said capacitor and said source terminal of said enhancement threshold transistor being connected to said lowest voltage on said chip; and a control transistor having a source terminal, a drain terminal and a gate terminal, said drain terminal of said control transistor being connected to said drain terminal of said enhanced threshold transistor, said gate terminal of said control transistor being connected to the output signal terminal of the oscillator and said source terminal of said control transistor being connected to said said gate terminal of said enhanced threshold transistor.

10. An improved method or generating an on-chip back-bias voltage for an NMOS integrated circuit comprising the steps of:

applying a highest voltage on the chip to an input end of a charge pump capacitor during a charging time of said capacitor;

applying a lowest voltage on the chip to an output end of said charge pump capacitor during said charging time of said capacitor;

decoupling said output end of said charge pump capacitor from a substrate of the chip during said charging time thereof;

clamping said output end of said capacitor to said lowest voltage on the chip with a clamping circuit during a time when the capacitor is being charged; and connecting said output end of said capacitor to said substrate of said chip during a non-charging time of said capacitor, said connecting step being accomplished by a coupling circuit comprising:

a switched transistor having a source terminal, a drain terminal and a gate terminal, a constant current source, said constant current source being connected between said gate terminal of said switched transistor and the substrate for biasing the average gate-to-source potential difference of the switched transistor to zero volts so that during the time said capacitor is being charged it is negative and during the capacitor non-charging time it is more positive than the switched transistor threshold voltage, said source terminal of said switched transistor being connected to said output end of said capacitor, said drain terminal of said switched transistor being connected to the substrate and said gate terminal of said switched transistor being connected via a further capacitor to an oscillator output signal terminal.

11. The improved method according to claim 10 wherein said highest voltage is $V_{CC}$.

12. The improved method according to claim 11 wherein said input end of said charge pump capacitor is a common connection between a drain and a source of a transistor and said output end of said charge pump capacitor is a gate connection of said transistor.

13. The improved method according to claim 10 wherein said lowest voltage is $V_{SS}$.

14. The improved method according to claim 13 wherein said input end of said charge pump capacitor is a common connection between a drain and a source of a transistor and said output end of said charge pump capacitor is a gate connection of said transistor.

15. The improved method according to claim 10 wherein said highest voltage is $V_{CC}$ and said lowest voltage is $V_{SS}$.

16. The improved method according to claim 15 wherein said input end of said charge pump capacitor is a common connection between a drain and a source of a transistor and said output end of said charge pump capacitor is a gate connection of said transistor.

17. The improved method according to claim 10 wherein said input end of said charge pump capacitor is a common connection between a drain and a source of a transistor and said output end of said charge pump capacitor is a gate connection of said transistor.

18. The improved method according to claim 10 wherein said clamping circuit of said clamping step further comprises:

an enhancement threshold transistor having a source terminal, a drain terminal and a gate terminal, said drain terminal of said enhancement threshold transistor being connected to said output end of said capacitor and said source terminal of said enhancement threshold transistor being connected to said lowest voltage on said chip; and a control transistor having a source terminal, a drain terminal and a gate terminal, said drain terminal of said control transistor being connected to said drain terminal of said enhanced threshold transistor, said gate terminal of said control transistor being connected to the output signal terminal of the oscillator and said source terminal of said control transistor being connected to said said gate terminal of said enhanced threshold transistor.

* * * * *